United States Patent [19]
Wu

[11] Patent Number: 5,937,023
[45] Date of Patent: Aug. 10, 1999

[54] METHOD AND CIRCUIT FOR DETECTING SMALL VARIATIONS IN CAPACITY VIA DELAY ACCUMULATION

[76] Inventor: Donald Wu, 12F., No. 59, Chang Chun Rd., Taipei, Taiwan

[21] Appl. No.: 08/870,304

[22] Filed: Jun. 5, 1997

[51] Int. Cl.$^6$ ....................................................... G01D 3/00
[52] U.S. Cl. ................................................ 377/19; 377/12
[58] Field of Search ......................................... 377/12, 19

[56] References Cited

U.S. PATENT DOCUMENTS

| | | | |
|---|---|---|---|
| 4,872,124 | 10/1989 | Shimizu et al. | 377/19 |
| 5,089,770 | 2/1992 | Lee et al. | 377/19 |

Primary Examiner—Timothy P. Callahan
Assistant Examiner—Eunja Shin
Attorney, Agent, or Firm—Bacon & Thomas, PLLC

[57] ABSTRACT

The present invention relates to a method for detecting a minor variation of capacity via accumulation and a circuit for detecting the same. An oscillated pulse signal is generated by a delay accumulating circuit which includes a logic device having an open drain and a pull up resistance. The generated pulse signal is then sent to a microprocessor via a counter. The microprocessor will determine whether there is a variation of the frequency of the pulse signal. When a variation of capacity is detected at the detecting polar plate connected to the testing terminal of the delay accumulating circuit, the microprocessor picks up and determines this variation. The present invention can be applied to a plurality longitudinal and transverse polar plates. When a conductor is moved along the polar plates, the variation of the capacity resulting from the movement of the conductor above the static capacity detecting plate can be readily detected. The static capacity detecting plate can be used as an input device for computer.

8 Claims, 11 Drawing Sheets

METHOD AND CIRCUIT FOR DETECTING SMALL VARIATIONS IN CAPACITY VIA DELAY ACCUMULATION

FIELD OF THE INVENTION

The present invention relates to a method for detecting a small variation of capacity, and more particularly, to a method for detecting a small variation of capacity via accumulation and a circuit for detecting the same. The method and circuit allows, the variation of static capacity within the detecting polar plate which is connected to the terminal of a circuit detecting device to be readily detected. The present invention can be incorporated within a static capacity detecting plate which serves as an inputting device for a cursor controller or plotter. It features excellent performance and the manufacturing costs are also cost effective.

DESCRIPTION OF PRIOR ART

There are a number of input device for a computer and its peripherals, such as a joy stick, mouse, track ball, touch screen and touch panel etc. Each of those input devices may attain to its intended purpose and is designed with different working principles.

The touch panels is composed of a digit/analog converting circuit and a plurality of tranverse and longitudinal detecting panels which cross each other. However, the cost of the digital/analog converting circuit is comparatively high. In light of this, it has not been accepted by the customer in different sectors.

SUMMARY OF THE INVENTION

It is an objective of this invention to provide an accumulating circuit having a detecting polar plate connected to the testing terminal. When the small variation in capacity is detected by the delay accumulating circuit, a resultant pulse signal of different frequency can be generated.

According to one aspect of the present invention, a counter is connected to the accumulating circuit. The counter is arranged to calculate and accumulate the pulse signal generated by the delay accumulating circuit. The accumulated signal is then transmitted to the microprocessor which determines whether there is a variation on the frequency of the input pulse signal.

The present invention can be suitably applied to different apparatus in different sectors. In one preferable embodiment, it can be applied in a touch inputting device for a cursor controller and/or plotter. By this arrangement, the computer may readily be incorporated with an effective and durable inputting device is a cost-effective manner.

It is also the objective of this invention to provide a method and circuit to detect the minor variation of capacity by means of an accumulating circuit, wherein a detecting terminal plate is connected to the testing terminal of the delay accumulating circuit. The delay accumulating circuit is further connected with a counter and a microprocessor to detect continuously the variation of the detected pulse frequency. The microprocessor will determine whether there is a variation in the static capacity. Accordingly, even a minor variation can be readily detected.

It is a still further objective of this invention to provide a method for detecting minor variation of capacity via accumulation and a circuit for detecting the same. The accumulating circuit can be applied to a static capacity detecting plate having a plurality of traverse and longitudinal polar panels that cross each other. The static capacity detecting plate may serve as an inputting device for a cursor controller or plotter to enforce performance and lower manufacturing cost.

BRIEF DESCRIPTION OF THE DRAWINGS

In order that the present invention may more readily be understood the following description is given, merely by way of example with reference to the accompanying drawings, in which.

DETAILED DESCRIPTION OF PREFERABLE EMBODIMENTS

Figure 1:
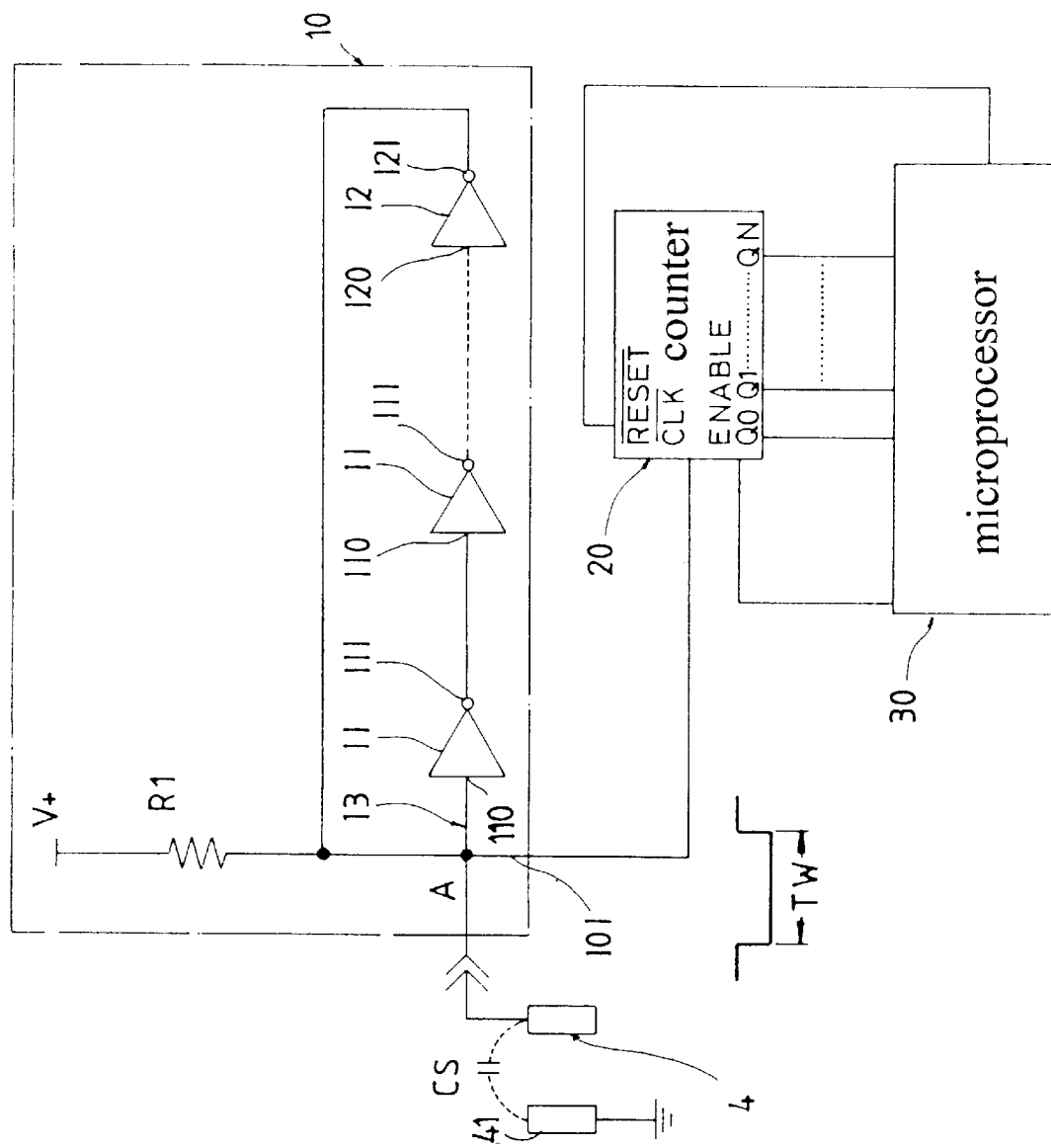
FIG. 1 is a block diagram of the circuit of the first embodiment of the present invention.

The present invention relates to a method for detecting a small variation of capacity via to accumulation a circuit for detecting the same. Referring to FIG. 1, the circuit includes a delay accumulating circuit 10, a counter 20 and a microprocessor 30. The output terminal 101 of the delay accumulating circuit 10 is connected to the pulse input terminal CLK of the counter 20. The output terminals Q0, Q1, . . . , QN are connected to the data input terminal of the microprocessor 30. The testing terminal A of the delay accumulating circuit 10 is connected to a detecting plate 4. The detecting plate is provided to detect the capacitor of the conductor 41 which is disposed at one side. In the preferred embodiment, the capacity is Cs.

The delay accumulating circuit 10 is composed of a plurality of first logic devices 11, or additional logic device 12 having an open drain at its output terminal, and a pull up resistor R1. The output terminals 111, 121 of the logic devices 11, 12 are connected to the input terminals 110, 120 of the adjacent logic devices 11, 12 by means of conductive wires. Accordingly, a loop circuit having oscillating function is established. The logic device 12 having an output terminal 121 with an, open drain is connected to the conductive wire of input terminal 110 of the other logic device 11 and also connected to the resistance R1. The other terminal of the resistance R1 is connected to a power source V+. In the present invention, the testing terminal A of the delay accumulating circuit 10 for detecting the detecting plate 4 is disposed at the conducting wire 13.

Referring to FIG. 1, the logic devices 11, 12 of the delay accumulating circuit 10 are NOT gates and these NOT gates jointly form a loop circuit which is an oscillating circuit. The number of the sum of the NOT gates is odd. The output terminal 101 of the delay accumulating. circuit 10 is located at the same position of the testing terminal A. However, other positions are also acceptable.

Figure 3:
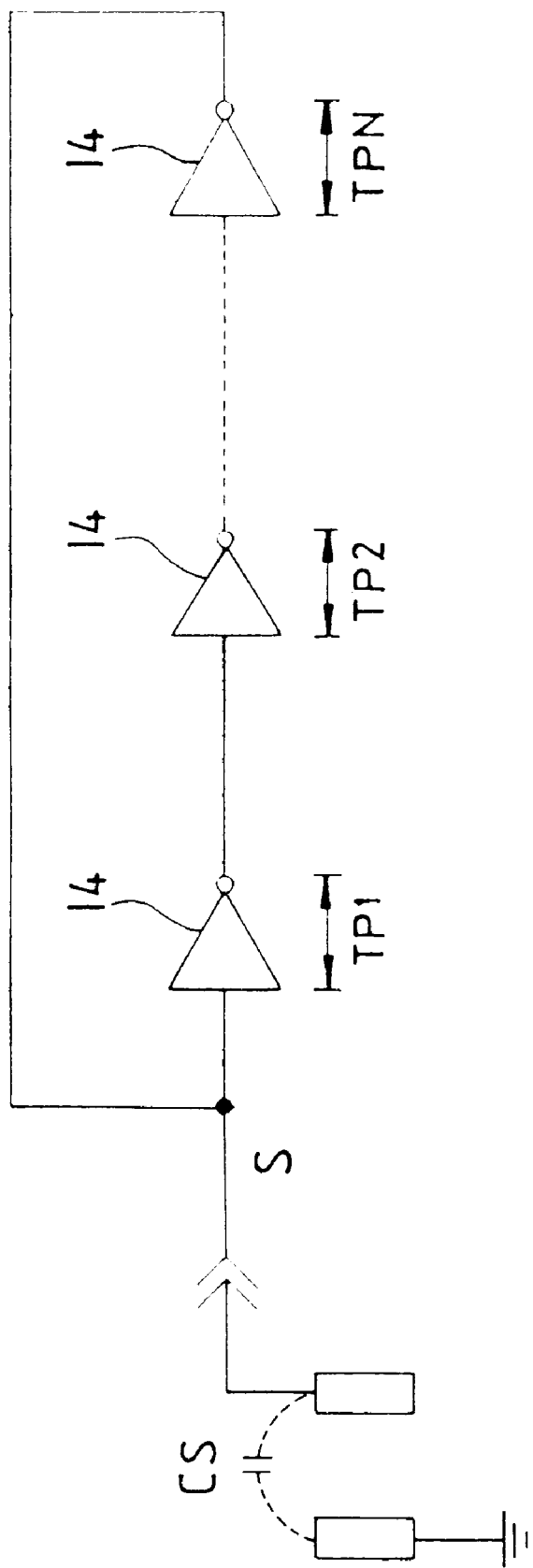
FIG. 3 is a circuit of general oscillator according to the prior art.
Figure 4:
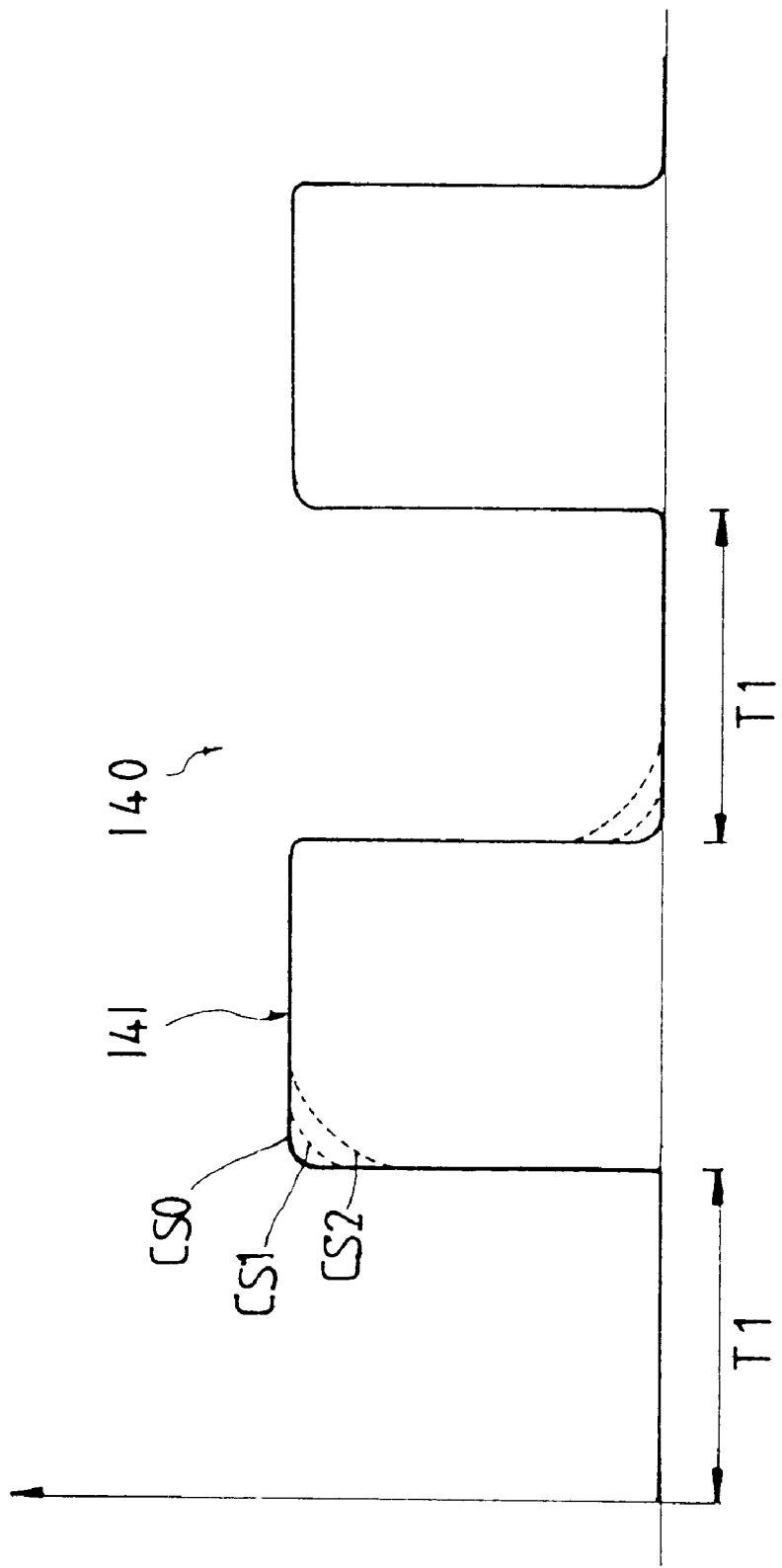
FIG. 4 is a time-voltage wave chart of the output oscillating pulse output from the oscillating circuit shown in FIG. 3.

Referring to FIG. 3, a conventional loop type oscillating circuit is shown. The signal propagation delay of the NOT gates 14 of the loop type oscillating circuit are tp1, tp2, . . . , tpN respectively. When the oscillating circuit is connected to a power source, the delay accumulating circuit 10 will generate a fixed frequency pulse signal 140 with the propagation delay time T1 (T1=tp1+tp2+. . . +tpN). Referring to FIG. 4, the designed output impedance of the NOT gates 14 is relative small. Accordingly, the change in the output terminal of the NOT gates 14 is from lower voltage into a high voltage will happen quickly. Accordingly, even though there is a testing terminal S within the loop type oscillating circuit and the static capacity of the detecting plate which is connected to the testing terminal S is varied, this minor changing is hard to observe from the charging voltage curve, as shown by the curves corresponding to CS0, CS1 and CS2 (CS0<CS1<CS2) respectively in FIG. 4.

In order to let the minor variation of the pulse signal at the testing terminal be effectively and quickly detected, a logic device (marked with 12 in FIG. 1) having an open drain is applied. The output terminal of the open drain is connected with a pull up resistance such that the charging voltage curve detected by the logic device becomes more and more smooth and can be readily analyzed, as shown in FIG. 5.

Figure 5:
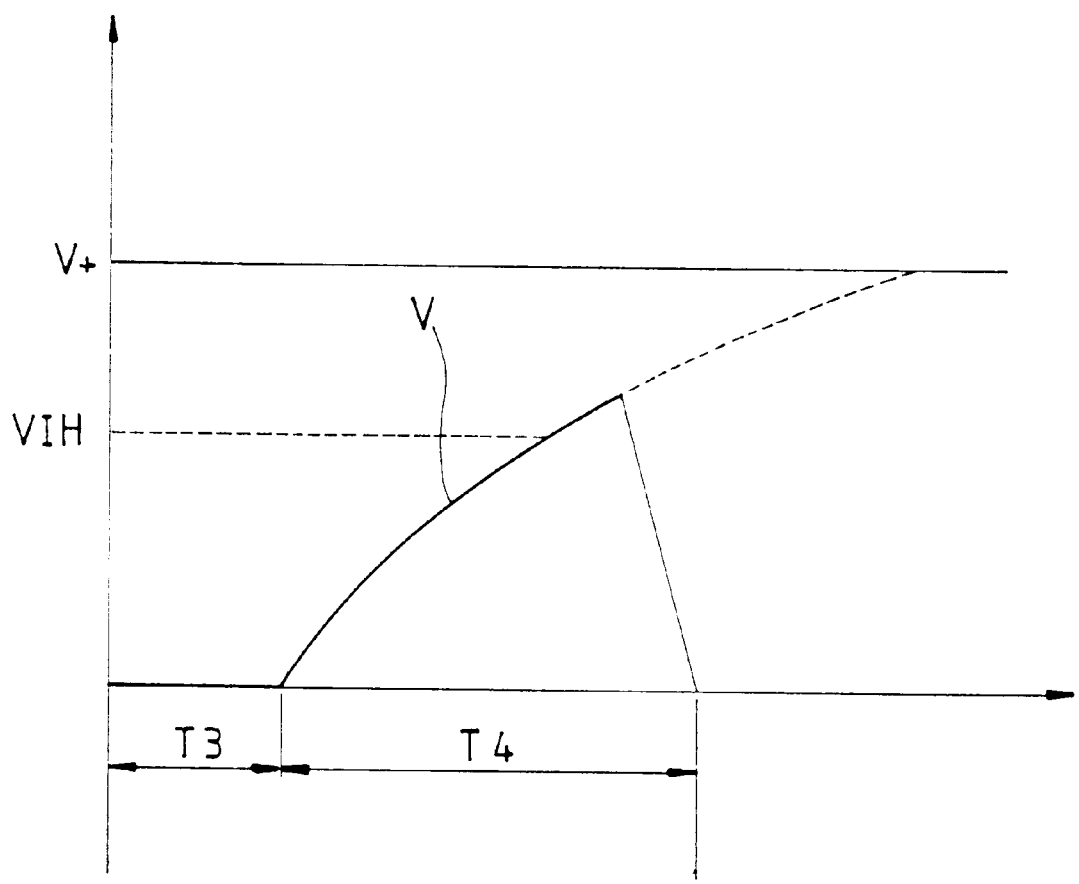
FIG. 5 is a time-voltage chart of the delay accumulating circuit at testing terminal A of the present invention.

Referring to FIG. 5, the charging voltage curve V is a curve detected by the testing terminal after the delay accumulating circuit 10 passes a propagation delay time T3 (T3=tp1+tp2+. . . +tpN), i.e. a charged voltage value to the resistance R1, input capacitor Ci of the testing terminal and the capacitor Cs of the detecting plate. The charged voltage value $V=(V+)\cdot\{1-\exp-[t/R1\cdot(Ci+Cs)]\}$, in which the period of the charging/discharging at the testing terminal is T4.

Figure 6:
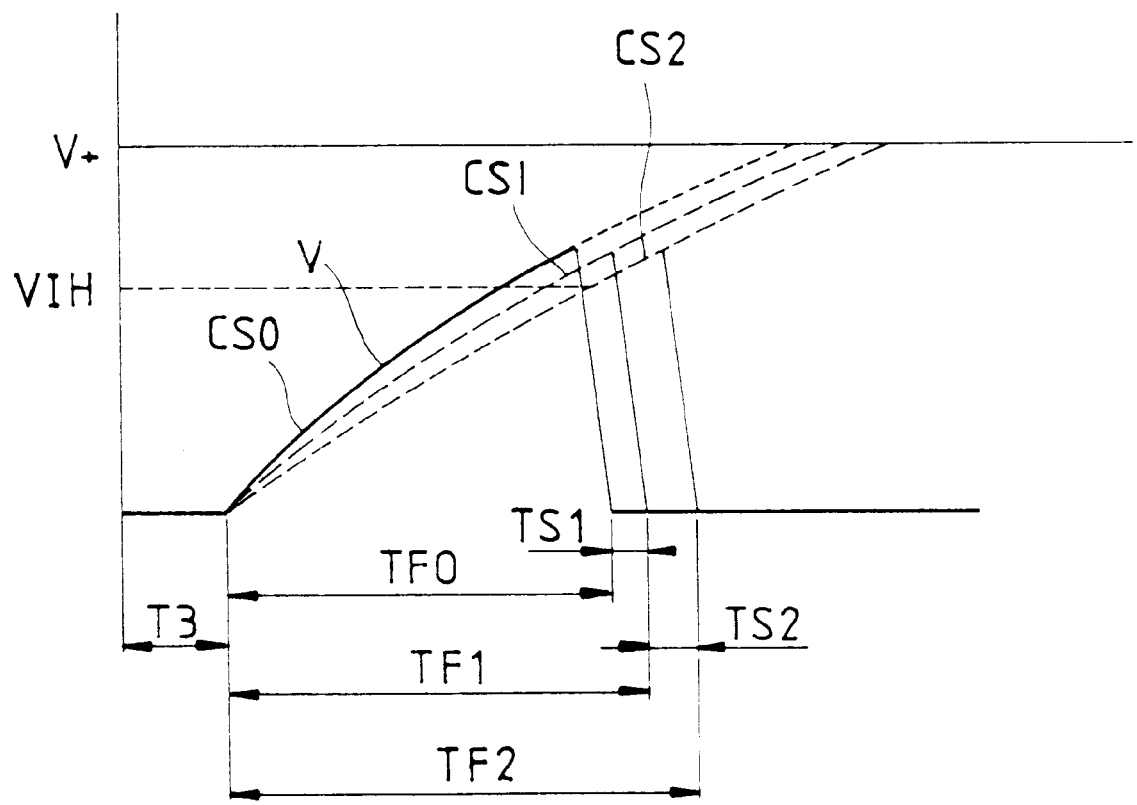
FIG. 6 is still a time-voltage chart of the delay accumulating circuit of the present invention wherein the capacity to be detected is different.

FIG. 6, shows the situation when the charging voltage V at the testing terminal A is larger than the input high voltage VIH of the NOT gate. (The input high voltage VIH means that the output low voltage potential at the NOT gate is a minimum voltage. Accordingly, the charging voltage value detected at the testing terminal A is changed to a low voltage when the charged voltage reaches the VIH voltage and the propagation delay time T3 is passed.

Referring to FIG. 6, when the values of the capacitor to be detected at the testing terminal A are Cs2, Cs1 and Cs0 respectively and the Cs2>Cs1>Cs0, then from the formula for the charging voltage, the larger the capacitor value, the longer the period of the oscillating pulse generated by the delay accumulating circuit 10, i.e. the smaller the frequency. From FIG. 6, when the capacity value of the detecting polar plate are Cs0 and Cs1 respectively, the period difference is TS1 and when the capacity value of the detecting polar plate are Cs1 and Cs2 respectively, the period difference is TS2 between those pair of oscillating pulses. Accordingly, in a different time interval, using the Tw time interval allows the counter 20 accumulate the period (or frequency) of the oscillating pulse from the output terminal of the delay accumulating circuit 10, and this accumulated period (or frequency) can be compared to find whether there is a variation. Accordingly, the variation of the capacity value at the testing terminal A can be readily determined.

Referring to FIG. 1, the counter 20 is used to accumulate the pulse signal output from the delay accumulating circuit 10 and this accumulated signal is converted into a digital signal which is sent to the microprocessor 30. The microprocessor 30 can compare the frequency (or period) of the input oscillating pulse, accordingly, any variation of the capacity value of the detecting polar plate can be detected.

Figure 2:
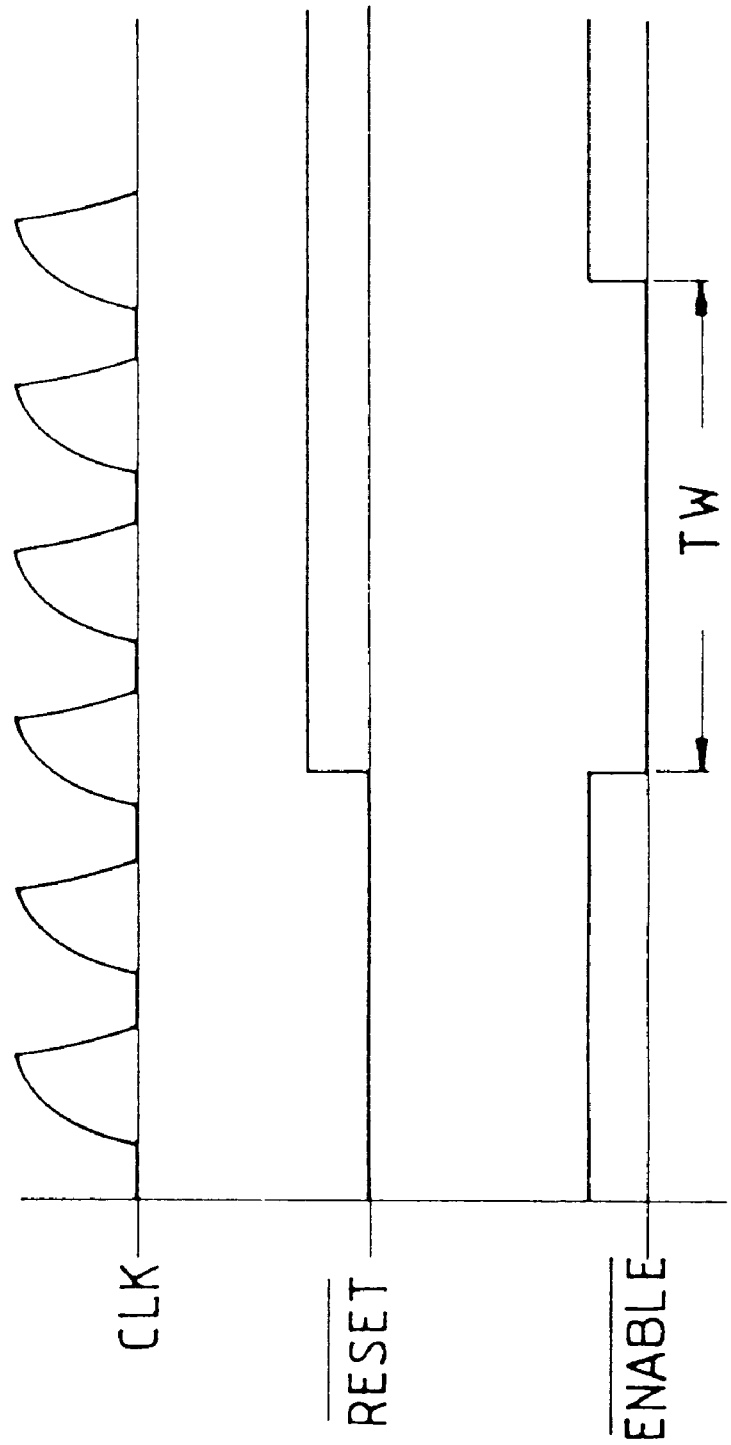
FIG. 2 is a detected wave form of the present invention.

Referring to FIG. 2, when the counter 20 is operating, it shall be reset firstly. Accordingly, the counter 20 will accumulate the oscillating pulse signal within time Tw. The frequency (or period) of the oscillating pulse signal will be digitized and is sent to the microprocessor 30. And the microprocessor 30 will determine whether the frequency (or period) of the input pulse signal is varied or not. If the microprocessor 30 detects a variation of the frequency of pulse signal, a corresponding signal will be generated by the microprocessor 30.

Figure 7:
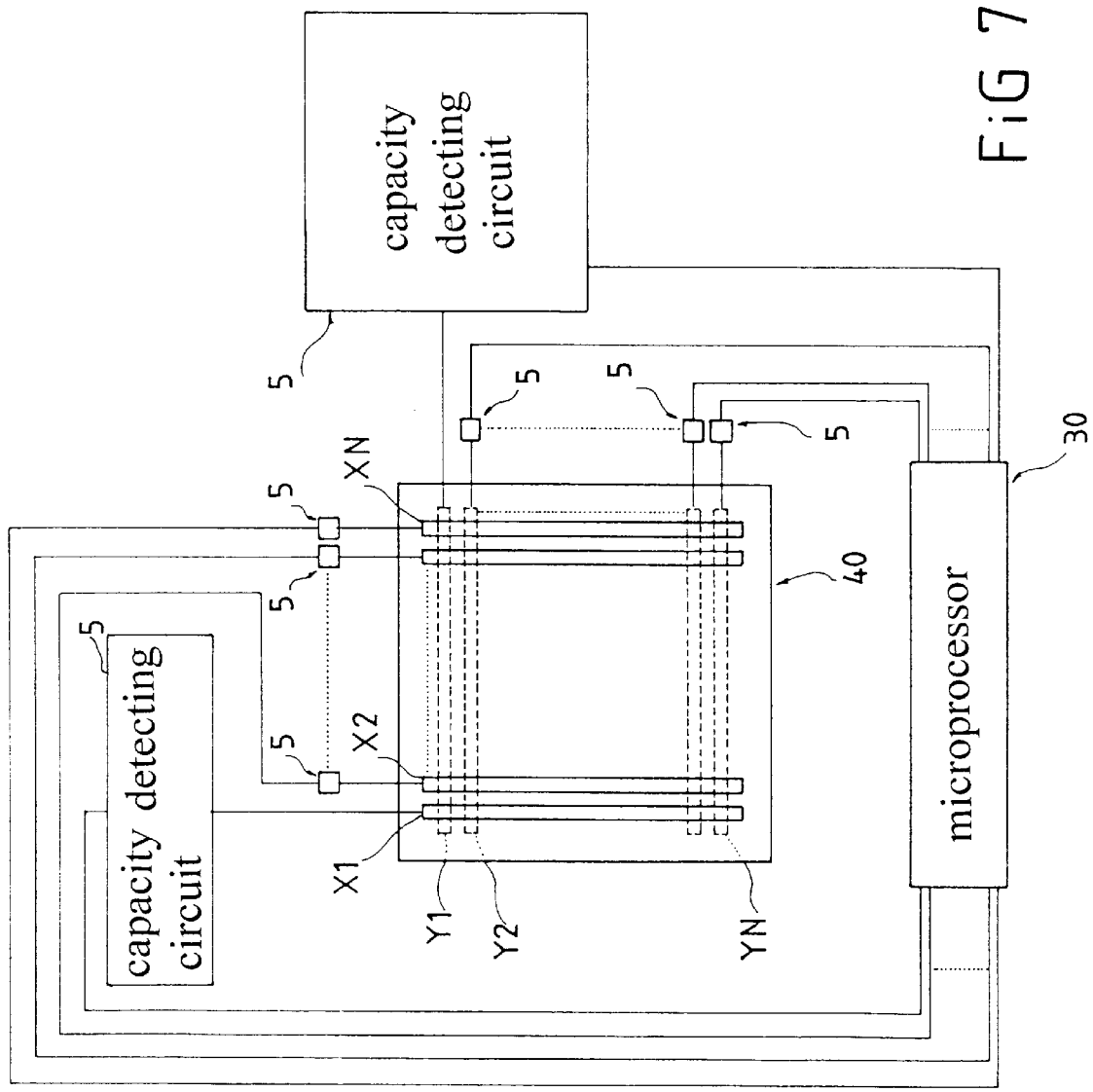
FIG. 7 is a preferable embodiment of the present invention.
Figure 8:
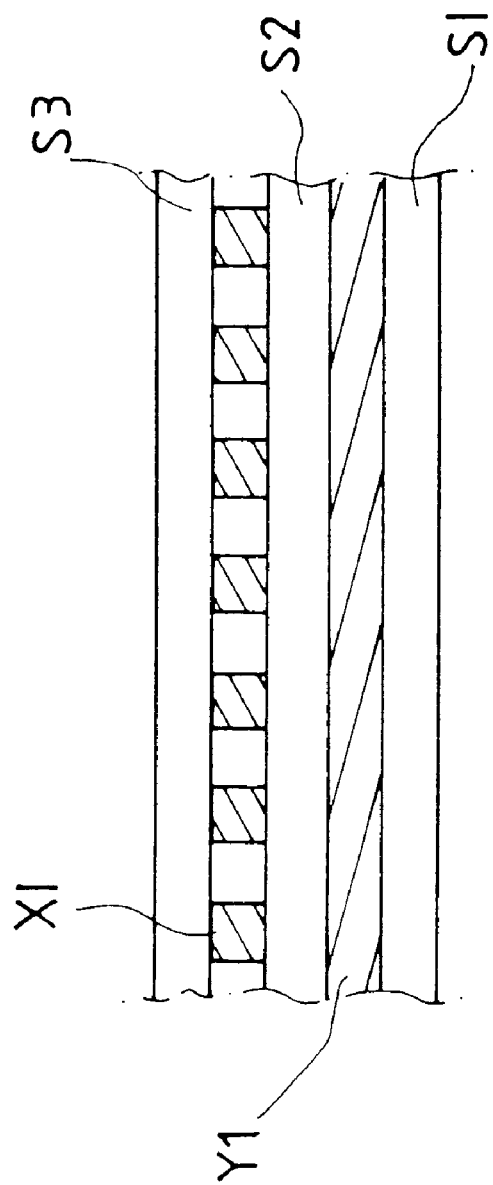
FIG. 8 is a cross sectional view of the static capacity detecting plate.

Referring to FIG. 7, another preferred embodiment is shown. In this embodiment, a static capacity detecting plate 40 is provided. As shown in FIG. 8, this static capacity detecting plate 40 includes three electric isolating plates S1, S2, and S3. The electric isolating plate S1 is provided with a plurality of conductive plates Y1, Y2, . . . , YN which are spaced apart from each other and juxtaposed longitudinally. The electric isolating plate S2 is disposed above those conductive plates Y1, Y2, . . . , YN and is provided with a plurality of conductive plates X1, X2, . . . , XN which are spaced from each other and juxtaposed transversely. The electric isolating plate S3 is disposed above the conductive plates X1, X2, . . . , XN.

The static capacity detecting plate 40 is provided with a capacity detecting circuit 5 at the end in which the conductive plates X1, X2, . . . , XN and the conductive plates Y1, Y2, . . . , YN are disposed. The capacity detecting circuit 5 is a combined circuit of the delay accumulating circuit 10 and the counter 20. On the other hand, the output terminal of the capacity detecting circuit 5 is connected to the microprocessor 30.

When the finger of an operator rests on or in put onto the capacity detecting plate 40, since the finger is a conductor, accordingly, a static capacity Cs is generated at the conductive plate corresponding to the finger. For example, when the finger is located at a position marked by X1 and Y4, then a corresponding capacity at X1 and Y4 will be generated respectively to the location of the finger. Then the digitized frequency of the oscillating pulse generated by the capacity detecting circuit 5 is sent to the microprocessor 30 and finally, the exact position in which the finger located will be determined by the static capacity detecting plate 40. Accordingly, it may serve as an inputting device for cursor controller and/or plotter. The operating function is preferable and the manufacturing cost is effective.

Figure 9:
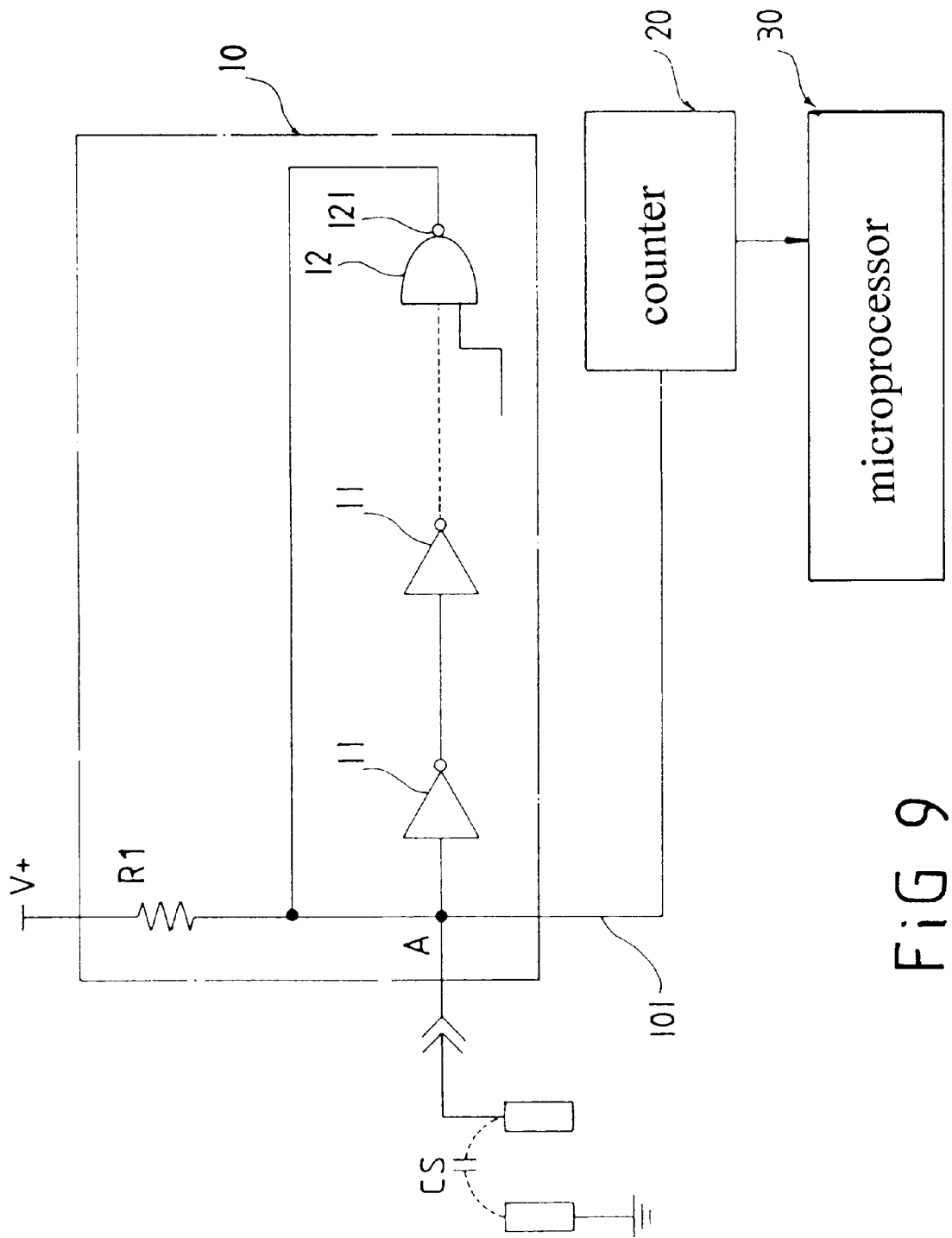
FIG. 9 is still a block diagram of another preferable embodiment of the present invention.
Figure 10:
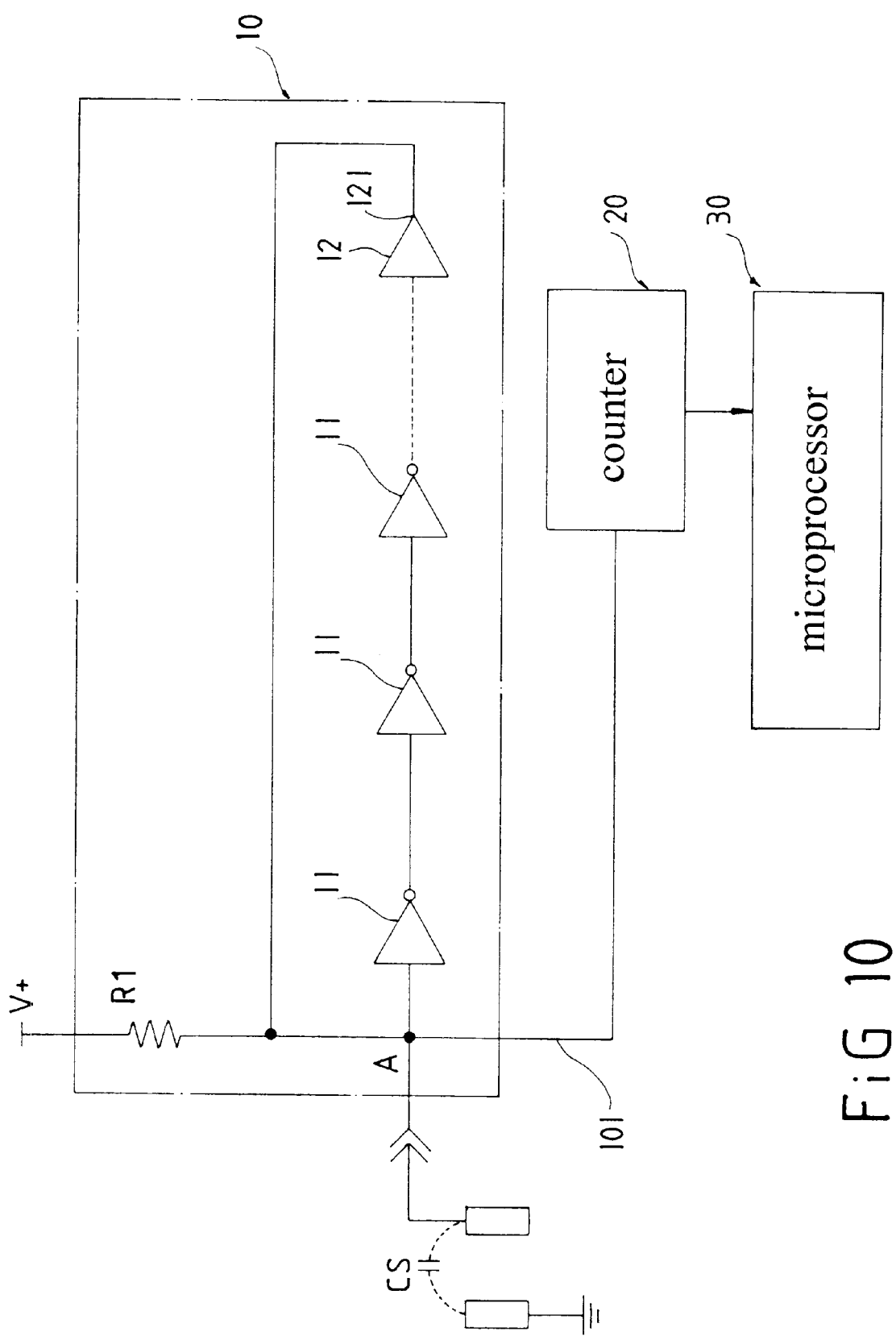
FIG. 10 is still a block diagram of a third preferable embodiment of the present invention.

The loop circuit of the delay accumulating circuit 10 can be configured with a plurality of logic devices having different functions. Referring to FIG. 9, the logic device 11 is configured by even number of NOT gates 11 and a NAND gate 12 having an open drain . The NOT gate 12 having an open drain may also be a NAND gate having three phases output terminal. Referring to FIG. 10, the logic device 11 may also configured by an odd number of NOT gates 11 and a buffer gate 12, and the buffer gate 12 may also be a buffer gate 12 having an open drain or a three phase output terminal.

Figure 11:
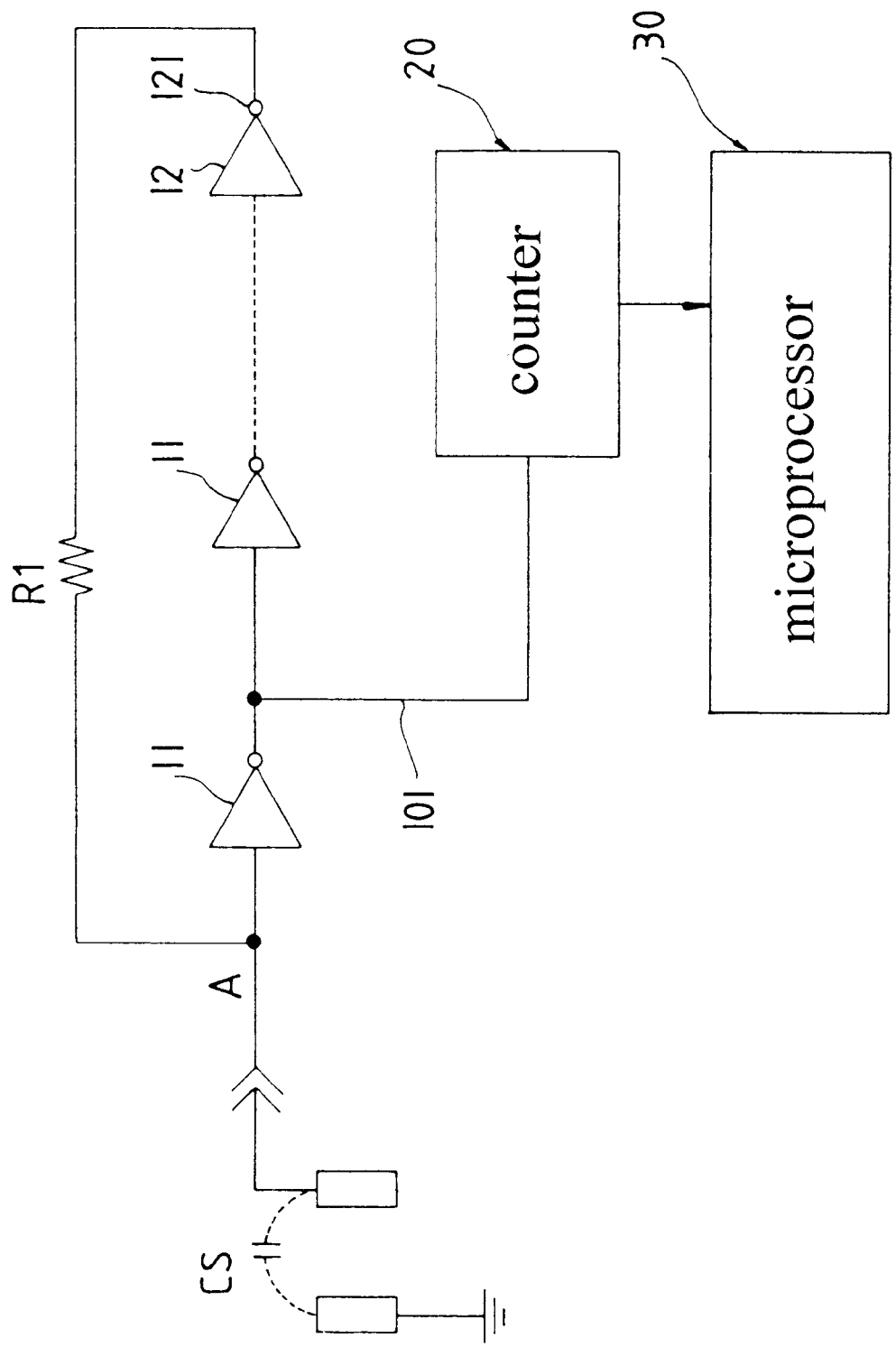
FIG. 11 is still a block diagram of a fourth preferable embodiment of the present invention.

Referring to FIG. 11, the resistance R1 connected to the delay accumulating circuit 10 may also disposed between the output terminal 120 of the logic device 12 having an open drain or three phases and the testing terminal A. Since the resistance R1 is not connected to the power source V directly, the charging constant at the testing terminal A can be raised to attain the same result as disclosed in FIG. 1. On the other hand, any position between any two logic devices 11 of the delay accumulating circuit 10 can serve as an output terminal 101 for connection with the counter 20. When the signal is output to the counter 20 and the microprocessor 30, the variation of the capacity can be also detected.

While particular embodiments of the present invention has been illustrated and described, it would be obvious to those skilled in the art that various other changes and modifications can be made without departing from the spirit and scope of the invention. For example, the NOT gate can be replaced by a logic device having NOR gate or gate or XOR gate. It is therefore intended to cover in the appended claims all such changes and modifications that are within the scope of the present invention.

I claim:

1. A circuit for detecting small variations in capacity, comprising:

a delay accumulating circuit including
      an oscillating circuit which includes a plurality of first logic devices, at least one of said first logic devices being a NOT gate,
      a pull up resistance, and
      an additional logic device having at least an open drain configured in a loop, wherein a conductive wire connected between an output terminal of said additional logic device having an open drain and an input terminal of one of said first logic devices is arranged to serve as a testing terminal, the output terminal of said additional logic device having an open drain being connected to said pull up resistance;
   a counter having an input terminal connected to said delay accumulating circuit, wherein when a pulse signal having a certain frequency is generated by said delay accumulating circuit, said generated pulse signal is accumulated by said counter as an input, said generated pulse signal being further converted into a digital signal; and
   a microprocessor having an input terminal which is connected to an output terminal of said counter, wherein a signal sent from said counter to said microprocessor is processed by the microprocessor and a frequency of said pulse signal in different time intervals is analyzed to determine whether a variation has occurred, and
   wherein said pull up resistance is connected between the output terminal of said additional logic device having an open drain and a power source.

2. A circuit as recited in claim 1, wherein said additional logic device having an open drain is a logic device having a three phase output.

3. A circuit for detecting small variations in capacity, comprising:

a delay accumulating circuit including
      an oscillating circuit which includes a plurality of first logic devices, at least one of said first logic devices being a NOT gate,
      a pull up resistance, and
      an additional logic device having an open drain configured in a loop,
      wherein a conductive wire between an output terminal of said additional logic device having an open drain and an input terminal of one of said first logic devices is arranged to serve as a testing terminal, the output terminal of said additional logic device having an open drain being connected to said pull up resistance;
   a counter having an input terminal connected to said delay accumulating circuit, wherein when a pulse signal having a certain frequency is generated by said delay accumulating circuit, said generated pulse signal is accumulated by said counter as an input, said generated pulse signal being further converted into a digital signal; and
   a microprocessor having an input terminal which is connected to an output terminal of said counter, wherein a signal sent from said counter to said microprocessor is processed by the microprocessor and a frequency of said pulse signal in different time intervals is analyzed to determine whether a variation has occurred, and
   wherein said pull up resistance is connected between the output terminal of said additional logic device having an open drain and the input terminal of said one of said first logic devices.

4. A circuit as recited in claims 1 or 3, wherein said first logic devices of said delay accumulating circuit are configured by an odd number of NOT gates.

5. A circuit as recited in claims 1 or 3, wherein said first logic devices of said delay accumulating circuit are configured by an even number of NOT gates and said additional logic device having an open drain is configured by a NAND gate.

6. A circuit as recited in claims 1 or 3, wherein said first logic devices of said delay accumulating circuit are configured by an odd number of NOT gates and said additional logic device having an open drain is configured by a buffer.

7. A circuit as recited in claims 1 or 3, wherein said first logic devices of said delay accumulating circuit are configured by an odd number of NOT gates and said additional logic device having an open drain is configured by a NOT gate.

8. A circuit as recited in claim 3, wherein said additional logic device having an open drain is a logic device having a three phase output.

* * * * *